United States Patent
Diab

(10) Patent No.: US 7,924,186 B2
(45) Date of Patent: *Apr. 12, 2011

(54) DUAL PURPOSE SERIALIZER/DE-SERIALIZER FOR POINT-TO-POINT AND POINT-TO-MULTIPOINT COMMUNICATION

(75) Inventor: Wael William Diab, San Francisco, CA (US)

(73) Assignee: Broadcom Corporation, Irvine, CA (US)

( * ) Notice: Subject to any disclaimer, the term of this patent is extended or adjusted under 35 U.S.C. 154(b) by 49 days.

This patent is subject to a terminal disclaimer.

(21) Appl. No.: 12/427,820

(22) Filed: Apr. 22, 2009

(65) Prior Publication Data
US 2009/0207057 A1 Aug. 20, 2009

Related U.S. Application Data

(63) Continuation of application No. 11/945,065, filed on Nov. 26, 2007, now Pat. No. 7,532,135.

(51) Int. Cl.
*H03M 9/00* (2006.01)
(52) U.S. Cl. .................. 341/100; 341/101; 375/355
(58) Field of Classification Search .................. 341/100, 341/101; 375/355, 356, 360; 713/400
See application file for complete search history.

(56) References Cited

U.S. PATENT DOCUMENTS

| | | | |
|---|---|---|---|
| 5,150,247 | A | 9/1992 | Sharpe et al. |
| 5,457,560 | A | 10/1995 | Sharpe et al. |
| 6,094,532 | A | 7/2000 | Acton et al. |
| 6,741,107 | B2 | 5/2004 | Borkar et al. |
| 6,785,354 | B1 | 8/2004 | Dietrich |
| 7,227,918 | B2 | 6/2007 | Aung et al. |
| 7,272,321 | B1 | 9/2007 | Kuo et al. |
| 7,295,644 | B1 | 11/2007 | Wu et al. |
| 2003/0039168 | A1 | 2/2003 | Chan et al. |
| 2004/0151272 | A1 | 8/2004 | Kenney et al. |
| 2005/0216654 | A1 | 9/2005 | Barth et al. |
| 2005/0258908 | A1 | 11/2005 | Mitric |
| 2006/0062341 | A1 * | 3/2006 | Edmondson et al. ......... 375/376 |
| 2007/0274348 | A1 * | 11/2007 | Friedman et al. ............. 370/503 |
| 2008/0050118 | A1 | 2/2008 | Haran et al. |
| 2009/0122939 | A1 * | 5/2009 | Hoang et al. .................. 375/375 |

OTHER PUBLICATIONS

Wael William Diab and Howard M. Frazier, "Ethernet in the First Mile: Access for Everyone," IEEE, Chapter 8, pp. 240-269, 2006.

* cited by examiner

*Primary Examiner* — Howard Williams
(74) *Attorney, Agent, or Firm* — Duane S. Kobayashi

(57) ABSTRACT

A dual purpose serializer/de-serializer (SerDes) for point-to-point and point-to-multipoint communication. A configurable SerDes can be designed to operate in one of a plurality of operating modes. Selection between the plurality of operating modes can be based on information received via a management interface. In one example, the various operating modes can be defined with different locking times and jitter characteristics.

17 Claims, 6 Drawing Sheets

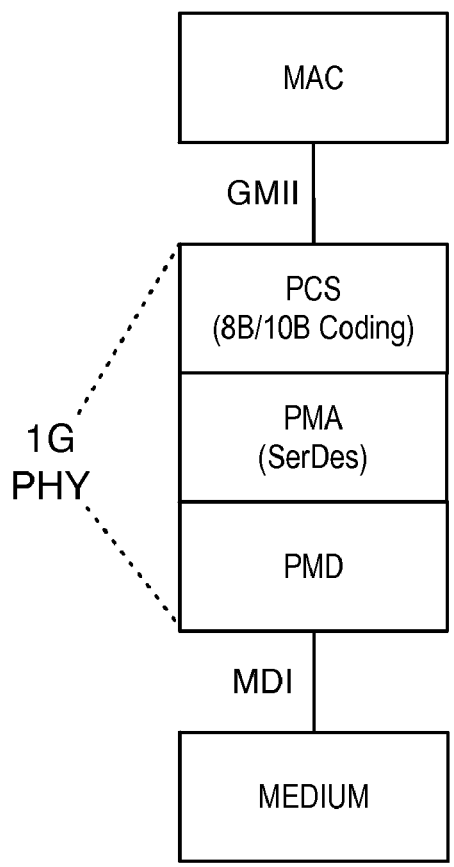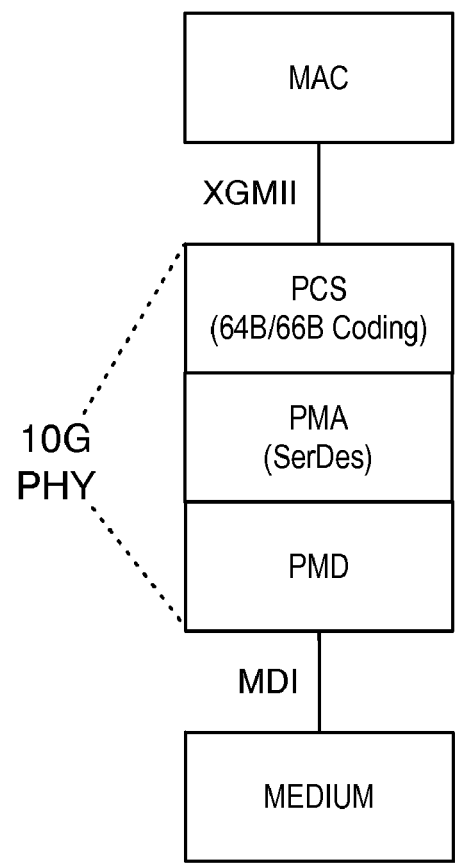
FIG. 1A                    FIG. 1B

DUAL PURPOSE SERIALIZER/DE-SERIALIZER FOR POINT-TO-POINT AND POINT-TO-MULTIPOINT COMMUNICATION

This application is a continuation of non-provisional application Ser. No. 11/945,065, filed Nov. 26, 2007, which is incorporated by reference herein, in its entirety, for all purposes.

BACKGROUND

1. Field of the Invention

The present invention relates generally to a serializer/de-serializer (SerDes) and, more particularly, to a dual purpose SerDes for point-to-point and point-to-multipoint communication.

2. Introduction

A SerDes is an integrated circuit (IC or chip) transceiver that converts parallel data to serial data and vice-versa. The transmitter section has parallel data lines coming in and a serial output data stream. The transmitter section can also have a phase-locked loop (PLL) that multiplies the incoming parallel clock up to the serial frequency. For example, a SerDes in a gigabit Ethernet system would include 10 parallel data lines that can be clocked at 125 Mhz, with the resulting serial output clocked at 1.25 Ghz. The gigabit Ethernet SerDes would commonly use an 8B/10B coding scheme that maps 8-bit symbols to 10-bit symbols to achieve DC-balance on the line. As would be appreciated, the receiver section is the reverse of the transmitter section and would have a serial data stream coming in with parallel data lines coming out.

FIG. 1A illustrates the implementation of a SerDes component within a gigabit Ethernet physical layer device (PHY). As illustrated, the gigabit Ethernet PHY includes a physical coding sublayer (PCS), a physical medium attachment (PMA), and physical media dependent (PMD). The PCS is generally responsible for encoding/decoding gigabit media independent interface (GMII) octets to/from ten-bit code-groups (8B/10B) for communication with the underlying PMA. Similarly, FIG. 1B illustrates the implementation of a SerDes component within a 10 G PHY. As illustrated, the 10 G Ethernet PHY's PCS is generally responsible for encoding/decoding 10 gigabit media independent interface (XGMII) 64-bit data to/from 66-bit code-groups (64B/66B) for communication with the underlying PMA.

In general, the PMA abstracts the PCS from the physical medium. Accordingly, the PCS can be unaware of whether the medium is copper or fiber. The primary functions of the PMA include mapping of transmit and receive code-groups between the PCS and PMA, serialization/de-serialization of code-groups for transmission/reception on the underlying serial PMD, recovery of clock from the coded data (e.g., 8B/10B, 64B/66B, etc.) supplied by the PMD, and mapping of transmit and receive bits between the PMA and PMD.

The PMD is generally responsible for generating electrical or optical signals depending on the nature of the physical medium connected. PMD signals are sent to the medium dependent interface (MDI), which is the actual medium connected, including connectors, for the various media supported.

As noted above, the PMA is responsible for the recovery of the received clock, which is used by the PCS to sample the data presented to it by the PMA. Conventional clock recovery mechanisms use delay locked loops (DLLs) or phase locked loops (PLLs) that align a local clock's phase to the phase of the recovered clock.

For point-to-point systems, the locking to an incoming embedded clock is a one-time event prior to the communication of data across the link. For this reason, the process of locking to an incoming embedded clock need not be bounded by a particular locking time requirement. As would be appreciated, the relaxed timing requirement for locking to an incoming embedded clock can relax the design requirements of the SerDes.

In a point-to-multipoint system such as an Ethernet passive optical network (EPON), a single optical line terminal (OLT) at a head end can be designed to communicate with a plurality of optical network units (ONTs) at various end nodes. This arrangement leverages a shared fiber optic plant by multiple networking nodes. Typically, the OLT broadcasts its transmissions in the downstream direction to all the ONTs. Each of the ONTs, on the other hand, transmit in the upstream direction to the OLT. It should be noted that the OLT and ONTs need not transmit at the same signaling rate or bandwidth. It should also be noted that the ONTs can be designed to share bandwidth or use a different wavelength in the upstream direction to eliminate overlap.

In receiving a plurality of individual communications from the various connected ONTs, the SerDes in the OLT is required to acquire phase and frequency for each of the individual ONT communications. The locking to an incoming embedded clock is therefore not a one-time event. With a stricter timing requirement to achieve a lock, the SerDes in the OLT faces tighter design constraints.

In the SerDes market, point-to-point and point-to-multipoint solutions will continue to exist as the markets expand. What is needed therefore is a SerDes design that can leverage increased volumes while meeting the needs of various point-to-point and point-to-multipoint applications.

SUMMARY

A dual purpose serializer/de-serializer for point-to-point and point-to-multipoint communication, substantially as shown in and/or described in connection with at least one of the figures, as set forth more completely in the claims.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which:

FIGS. 1A and 1B illustrate implementations of a SerDes component within gigabit and 10 G Ethernet physical layer devices.

DETAILED DESCRIPTION

Various embodiments of the invention are discussed in detail below. While specific implementations are discussed, it should be understood that this is done for illustration purposes only. A person skilled in the relevant art will recognize that other components and configurations may be used without parting from the spirit and scope of the invention.

A SerDes enables a quick and reliable transfer of data from one physical location to another. Here, data that exists in a parallel bus form is serialized to a single high-speed signal. In addition to the use of a SerDes in point-to-point systems, SerDes have also been incorporated into point-to-multipoint solutions.

Figure 2:
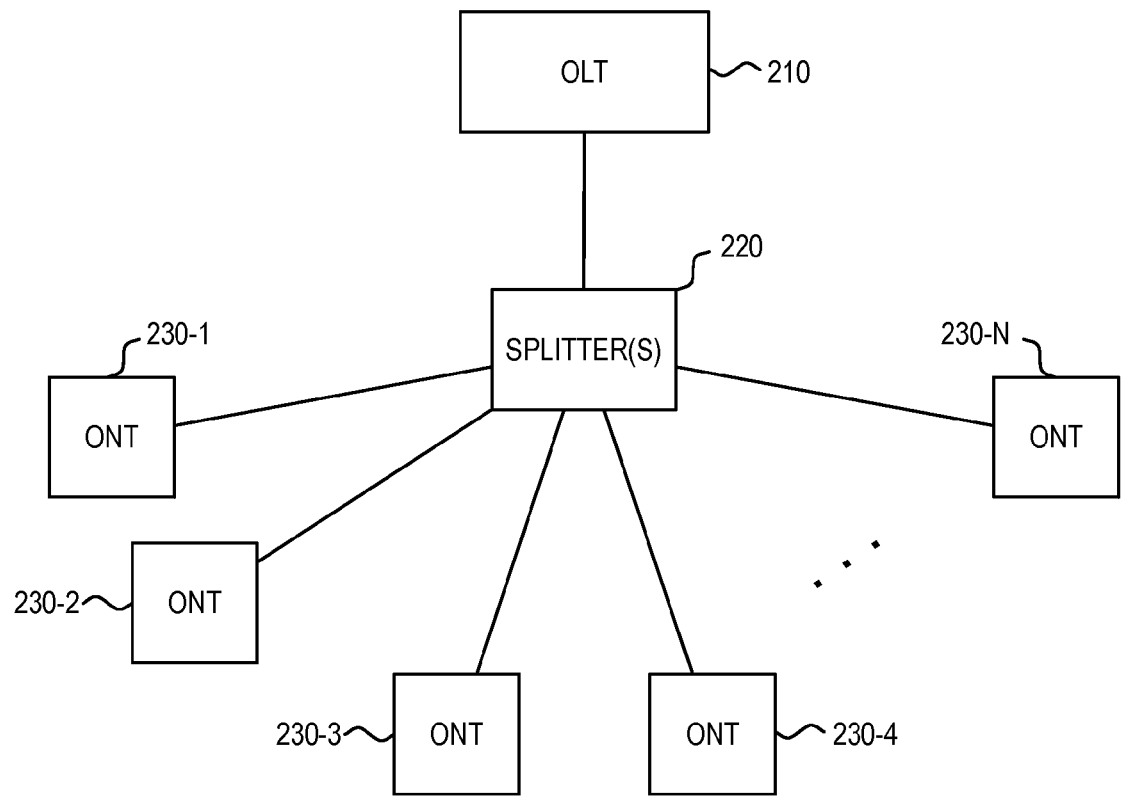
FIG. 2 illustrates an example of a point-to-multipoint communication network.

FIG. 2 illustrates an example of a point-to-multipoint communication network. As illustrated, the point-to-multipoint network includes a single OLT 210 that communicates to a plurality of ONTs 230-*n* via a PON. The illustrated PON includes splitter(s) 220, which enable a single feeder cable to be split into multiple drop cables for the individual ONTs 230-*n*. In one embodiment, a single splitter (e.g., 1:16) is used. In another embodiment, two stages of splitting can be used. For example, a single 1:2 splitter can be combined with two 1:8 splitters to accommodate 16 separate drop cables.

Figure 3A:
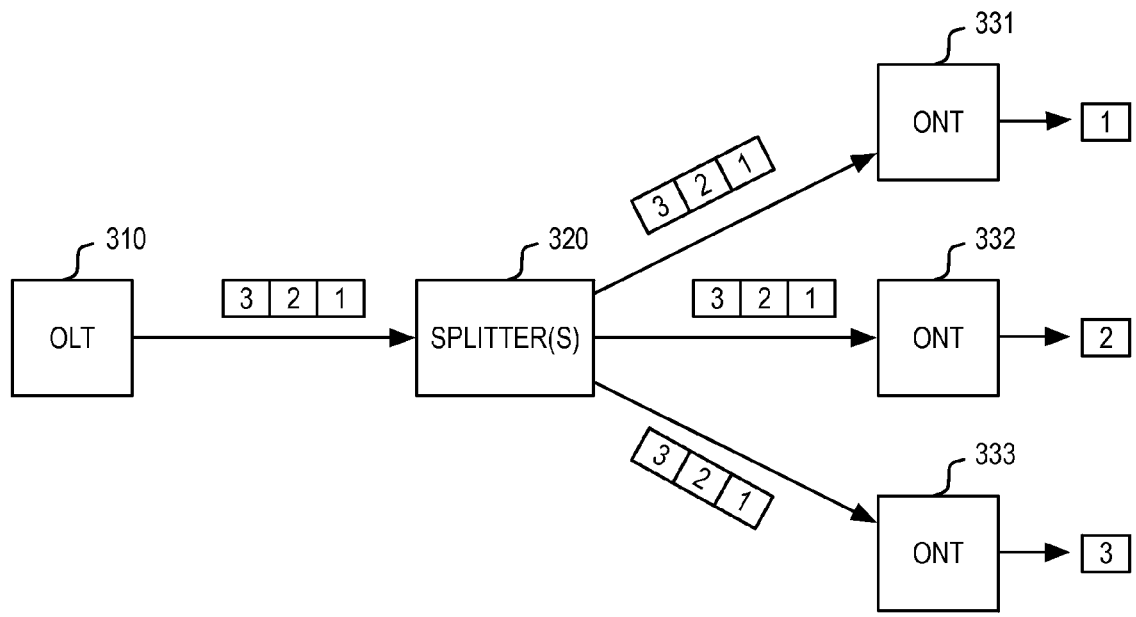
FIGS. 3A and 3B illustrate the communication between a single head end OLT and a plurality of end node ONTs.
Figure 3B:
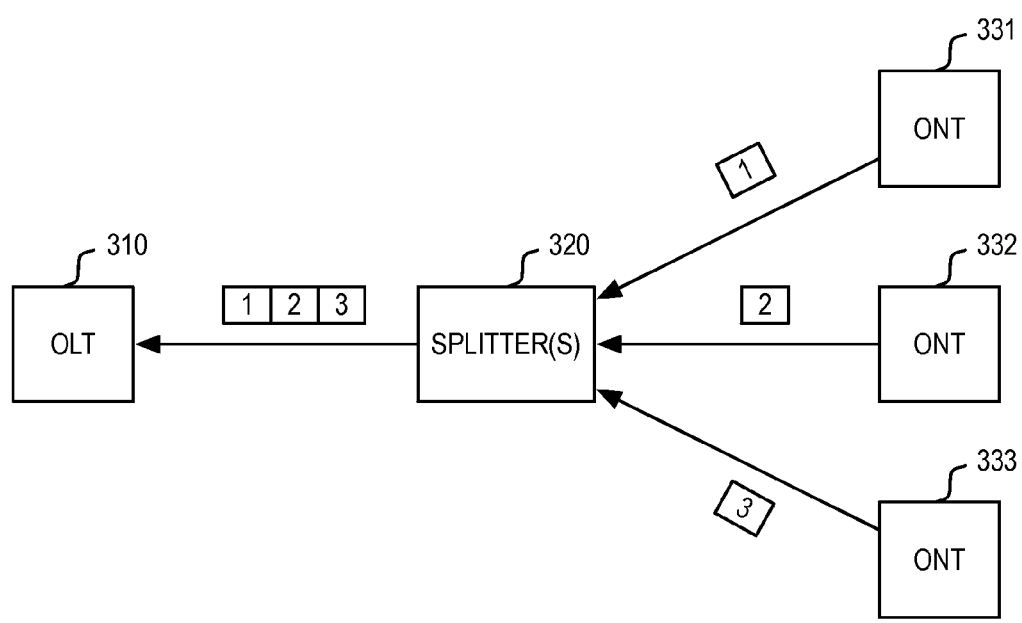

The advantage of the PON is that it allows sharing of the fiber optic plant by multiple network nodes. FIGS. 3A and 3B illustrate an example of the downstream and upstream communication between a single head end OLT and a plurality of end node ONTs in an Ethernet PON (EPON). In the downstream direction illustrated in FIG. 3A, OLT 310 transmits packets 1, 2, 3 for each of the respective connected ONTs 331, 332, 333. As illustrated, each of ONTs 331, 332, 333 receive the stream of packets, wherein each of ONTs 331, 332, 333 are responsible for extracting the particular packet that is destined for that location.

In the upstream direction illustrated in FIG. 3B, each of ONTs 331, 332, 33 transmit their own packets back to OLT 310. In this upstream communication process, ONTs 331, 332, 333 are designed to transmit in a way to avoid collisions between the packets. In one embodiment, the PON uses a time division multiple access (TDMA) communication protocol. In this way, the individual packet communications from ONTs 331, 332, 333 would be designed to fit into assigned time slots for transmission to OLT 310.

As has been described, the downstream transmission by OLT 310 is continuous as each ONT receives the same stream of packets. This direction of communication would be similar to a point-to-point system in that the SerDes in ONTs 331, 332, 333 can perform a one-time lock to the incoming embedded clock.

In the upstream direction, on the other hand, the SerDes in OLT 310 receives a plurality of individual communication streams from ONTs 331, 332, 333 in the upstream direction. This burst-mode communication in the PON places a significant burden on the SerDes in OLT 310. Instead of a one-time lock to an incoming embedded clock, the SerDes in OLT 310 must repeatedly lock to the incoming data streams from ONTs 331, 332, 333. This results since the clocks used by each of ONTs 331, 332, 333 can vary to different degrees in frequency and phase.

Figure 4:
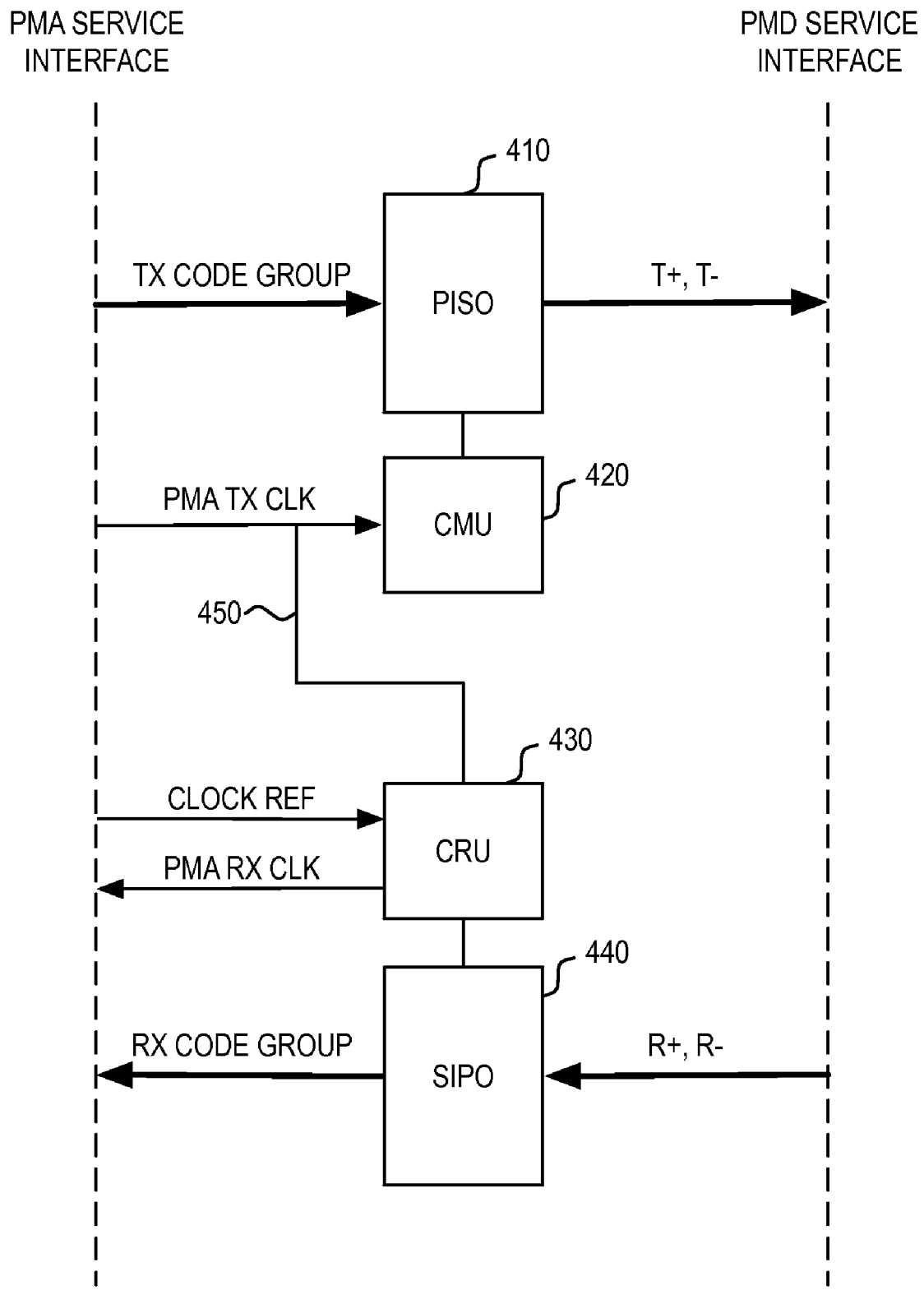
FIG. 4 illustrates an example embodiment of the SerDes functionality in a PMA.

As noted, the SerDes functionality is typically implemented in the PMA. FIG. 4 illustrates an example embodiment of the SerDes functionality in a PMA. As illustrated, the PMA includes parallel-in-serial-out (PISO) block 410 that takes the TX code group output from the PCS and generates a serial output for the PMD. The operation of PISO 410 is based on a clock signal generated by clock multiplier unit (CMU) 420, which multiplies the incoming parallel PMA TX clock. In one embodiment, PISO 410 has a single shift register that receives the parallel data once per parallel clock and shifts it out at the higher serial clock rate.

For a gigabit Ethernet system, the TX code group would be generated by an 8B/10B encoder, with PISO 410 operating in accordance with a 125 Mhz clock multiplied by 10 to produce a 1.25 Ghz clock. For a 10 G Ethernet system, the TX code group would be generated by a 64B/66B encoder, with PISO 410 operating in accordance with a 644.5 Mhz clock multiplied by 16 to produce a 10.3125 Ghz clock.

On the receive side, the PMA includes serial-in-parallel-out (SIPO) block 440 that takes the serial input from the PMD and generates the RX code group for the PMA. The RX code group is processed by the PCS in accordance with an embedded clock in the received signal. This recovered clock signal is generated by clock recovery unit (CRU) 430, which divides the incoming clock down to the parallel rate for output to the PCS. In one embodiment, the operation of CRU 430 is based on a delay locked loop (DLL) or a phase locked loop (PLL). As would be appreciated, the specific location of the DLL or PLL within the PHY would be implementation dependent.

With burst-mode communication, the SerDes would need to lock onto each individual communication stream from the various ONTs. This locking process would be governed by a much stricter timing requirement as compared to standard point-to-point communication. For example, while a point-to-point system can operate satisfactorily with a locking time of approximately 1000 bit times, the operation in a burst-mode communication can require a stricter threshold that may be at least one order of magnitude lower.

One technique that can be used to decrease the locking time is to prevent the receive DLL/PLL from floating. In effect, a floating PLL would require locking from a cold start. To ease this condition, the clock recovery can be tied to the transmit clock to prevent straying. FIG. 4 illustrates an example of this technique where CRU 430 also receives the transmit clock via signal path 450. In burst-mode operation, CRU 430 can then use the transmit clock in the transition between different streams to assure that the locking time is minimized.

In general, the reduction of the locking time comes at a cost. For example, efforts to produce a shorter locking process produce worse jitter results. A tradeoff between lock timing and jitter therefore results. In addition, the need to improve the locking time can lead to broader re-architecture efforts such as the use of digital signal processing (DSP) as compared to CMOS or Bi-CMOS technology. Herein lies another tradeoff as DSP solutions typically required greater amounts of power.

In accordance with the present invention, it is recognized that the operation of a SerDes in point-to-point and point-to-multipoint modes leads to significant design tradeoffs on varying levels. These design tradeoffs lead to differentiated SerDes designs that are necessarily targeted at a particular mode of operation. In the manufacturing context, this leads to significant cost inefficiencies as the production of multiple designs leads to an inability to benefit from large economies of scale.

It is therefore a feature of the present invention that a SerDes design is provided that is operational in multiple modes. In one embodiment, the SerDes design is functional in both point-to-point and point-to-multipoint modes of operation. To illustrate the principles of the present invention, reference is now made to FIG. 5, which illustrates an example gigabit Ethernet SerDes transceiver that can be configured for use in multiple operational modes.

As illustrated, SerDes transceiver 500 includes transmitter section 510 and receiver section 520. Transmitter section 510 includes transmitter 511, PISO 512, encoder 513 (e.g., 8B/10B, 64B/66B, etc.), and transmit FIFO 514. Receiver section 520 includes receiver 521, SIPO 522, clock recovery 523, decoder 524 (e.g., 8B/10B, 64B/66B, etc.), and alignment FIFO 525.

Figure 5:
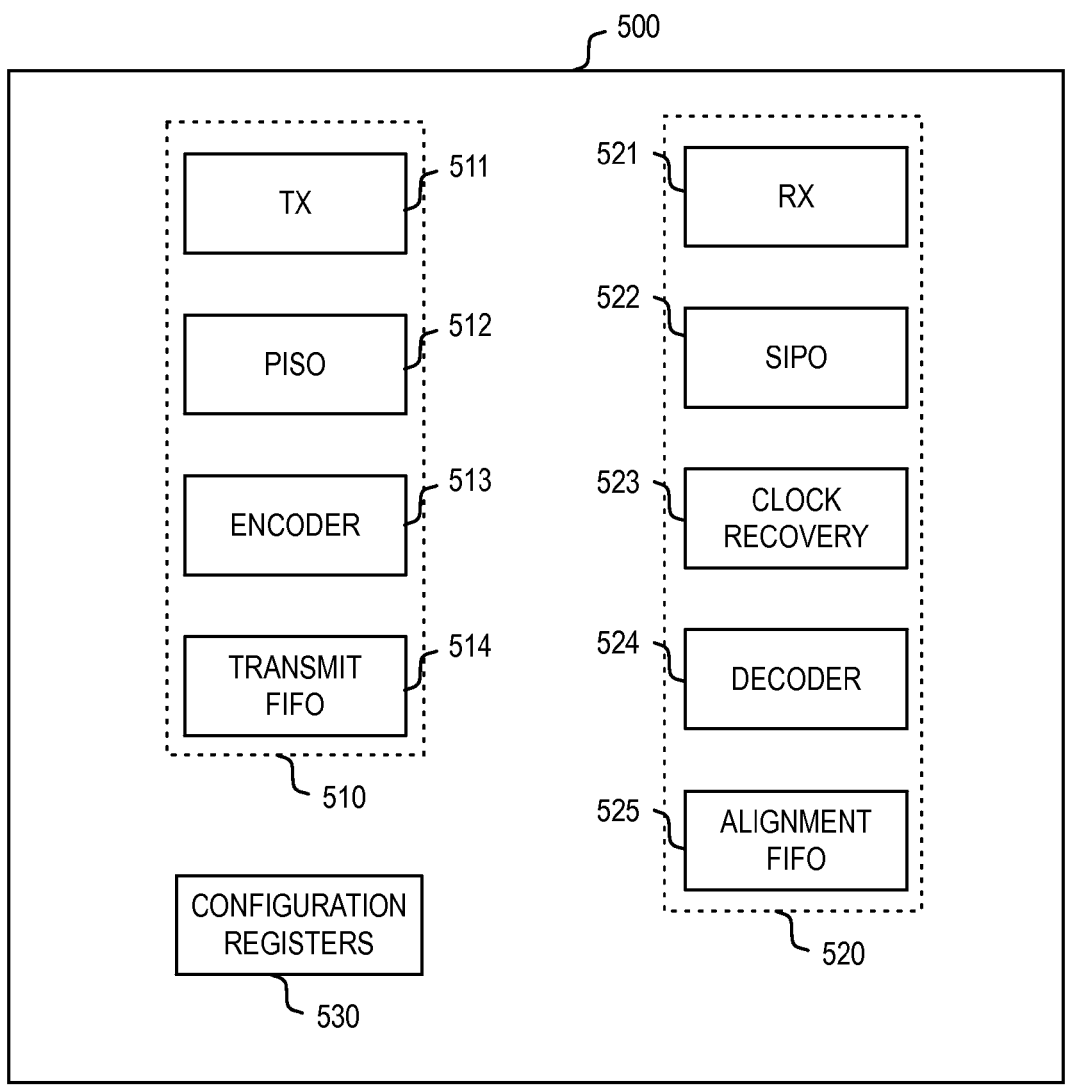
FIG. 5 illustrates a PHY that can be configured for use in multiple operation modes.

As FIG. 5 further illustrates, SerDes transceiver 500 also includes configuration registers 530. Configuration registers 530 represents a common functional block that enables storage of configuration parameters that can be used to configure one or more of transmit section 510 and receiver section 520. As would be appreciated, transmitter section 510 and receiver section 520 can also share common logic components such as a timing block.

In one embodiment, the configuration parameters in configuration registers 530 can be programmed through a management interface (not shown). For example, the management interface can define the operational characteristics of a DLL/PLL. In one scenario, the operational characteristics can define the relative tradeoff between lock timing and jitter. In another scenario, the operational characteristics can define the relative power consumption. As such, the management interface can be used to configure the operational mode of the SerDes to enable it, for example, to operate in either a point-to-point or point-to-multipoint environment.

In one embodiment, SerDes transceiver 500 can also be configured with one or more pins that can dictate SerDes receiver operation depending on a mode of operation. For example, a pin can be used to control the times that the receiver is locked to the transmit clock and the times that the receiver is locked to the embedded clock in the received signal. The control using this pin would be useful when operating in a point-to-multipoint mode to prevent the receiver from floating during the transition time between received streams.

Figure 6:
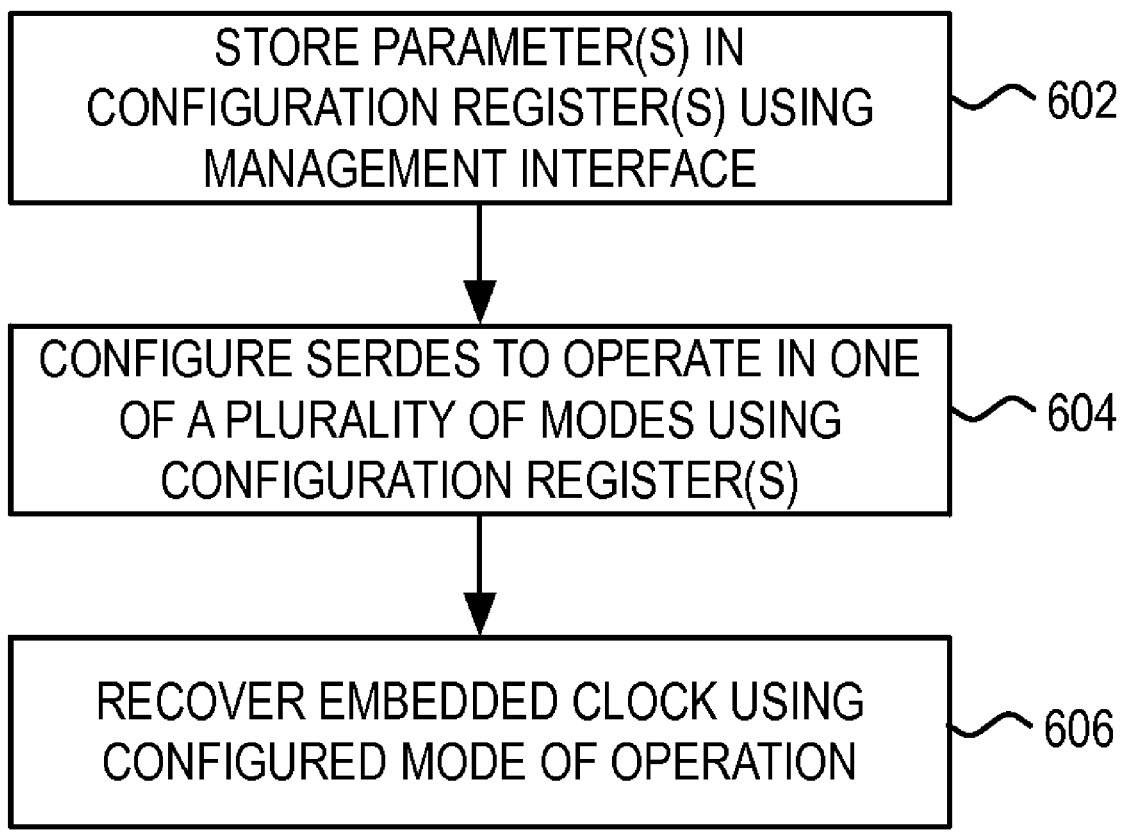
FIG. 6 illustrates a flowchart of a process for configuring a SerDes component for use in one of multiple modes.

To illustrate flexibility of operation in the SerDes of the present invention, reference is now made to the flowchart of FIG. 6. As illustrated, the process begins at step 602 where one or more parameters received via a management interface are stored in the configuration register(s). In one example, these configuration registers are loaded upon an identification of the particular environment in which the SerDes will be used. For instance, if the SerDes is to be used in an OLT, then it can be configured for point-to-point or point-to-multipoint use. Similar configurations can also be used for SerDes to be included in an ONT. The key here is that a single SerDes design can be manufactured. This is in contrast to a situation where one SerDes design is for point-to-point use, while another SerDes design is for point-to-multipoint use. Manufacturing efficiencies can therefore be leveraged in the sales of SerDes components to customers.

After the configuration register(s) are set, at step 604, the SerDes can then be configured for operation based on the contents of the configuration register(s). For example, the SerDes can be configured upon powering to operate in accordance with one or more configuration parameters that are retrieved from the configuration register(s). As would be appreciated, the particular type and manner of configuration of the SerDes would be implementation dependent. The significance is the configurability of the SerDes itself.

Finally, at step 606, the embedded clock is recovered from the received signal using the configured mode of operation. As noted, the clock recovery process could be enabled by a DLL/PLL that has been configured using the configuration parameter(s). In another example, the clock recovery process can be aided by one or more pins that dictate particular signal routings within the SerDes. As noted above, a pin can be used to dictate whether the SerDes is locked to the transmit clock, such as during a transition time between different communication streams.

As has been described, a SerDes mechanism has been provided that enables a single SerDes design to be applied to various modes of operation. These various modes of operation can represent those modes that are on different ends of a design tradeoff.

It should be noted that the principles of the present invention outlined above can be applied to various contexts. For example, the principles of the present invention can be used in SerDes of different standard or non-standard network speeds (e.g., 1G, 2.5G, 10G, etc.), and various point-to-point (e.g., Ethernet, non-Ethernet, etc.) and point-to-multipoint networks (e.g., PON, EPON, EPON, 10GEPON, etc.), These and other aspects of the present invention will become apparent to those skilled in the art by a review of the preceding detailed description. Although a number of salient features of the present invention have been described above, the invention is capable of other embodiments and of being practiced and carried out in various ways that would be apparent to one of ordinary skill in the art after reading the disclosed invention, therefore the above description should not be considered to be exclusive of these other embodiments. Also, it is to be understood that the phraseology and terminology employed herein are for the purposes of description and should not be regarded as limiting.

What is claimed is:

1. A serializer/de-serializer method, comprising:
storing, via an operation mode management interface, a parameter in a register of a serializer/de-serializer;
configuring, based on said parameter stored in said register, a clock recovery module of said serializer/de-serializer to operate in one of a first operating mode and a second operating mode, said first and second operating modes being characterized by different locking time periods; and
recovering an incoming embedded clock from a received signal using said configured operating mode.

2. The method of claim 1, wherein said configuring comprises configuring a phase locked loop or a delay locked loop.

3. The method of claim 1, wherein said configuring comprises configuring an amount of power consumption.

4. The method of claim 1, wherein said configuring comprises configuring an amount of jitter.

5. The method of claim 1, wherein said configuring comprises configuring said clock recovery module to operate in one of a point-to-point mode and a point-to-multipoint mode.

6. The method of claim 1, wherein said configuring comprises configuring at power up.

7. A serializer/de-serializer, comprising:
a clock recovery module that is configurable to operate in a first mode capable of locking onto an incoming embedded clock within a first locking time period, and in a second mode capable of locking onto an incoming embedded clock within a second locking time period shorter than said first locking time period, wherein a configuration of said clock recovery module is based on one or more parameters retrieved from a configuration register.

8. The serializer/de-serializer of claim 7, wherein said first locking time period is for use in a point-to-point communication network.

9. The serializer/de-serializer of claim 7, wherein said second locking time period is for use in a point-to-multipoint communication network.

10. The serializer/de-serializer of claim 7, wherein said first mode has a better jitter characteristic than said second mode.

11. The serializer/de-serializer of claim 7, wherein said first mode has a lower power consumption level than said second mode.

12. The serializer/de-serializer of claim 7, wherein said configuration occurs at power up of the serializer/de-serializer.

13. A serializer/de-serializer, comprising:
a configuration register;
a clock recovery module that is configured at power up to operate in a selected one of a plurality of operating modes in accordance with one or more parameters that are retrieved from said configuration register, wherein at least two of said plurality of operating modes have different locking time for recovering an embedded clock.

14. The serializer/de-serializer of claim 13, wherein at least two of said plurality of operating modes have different jitter characteristics.

15. The serializer/de-serializer of claim 13, wherein at least two of said plurality of operating modes have different power consumption levels.

16. The serializer/de-serializer of claim 13, wherein at least two of said plurality of operating modes have different delay locked loop or phase locked loop operational characteristics.

17. The serializer/de-serializer of claim 13, wherein a first operating mode is a point-to-point mode and a second operating mode is a point-to-multipoint mode.

* * * * *